(12) United States Patent
Huang

(10) Patent No.: US 9,886,526 B2
(45) Date of Patent: Feb. 6, 2018

(54) 3D PRINTING SHRINKAGE COMPENSATION USING RADIAL AND ANGULAR LAYER PERIMETER POINT INFORMATION

(71) Applicant: University of Southern California, Los Angeles, CA (US)

(72) Inventor: Qiang Huang, Rancho Palos Verdes, CA (US)

(73) Assignee: UNIVERSITY OF SOUTHERN CALIFORNIA, Los Angeles, CA (US)

( * ) Notice: Subject to any disclaimer, the term of this patent is extended or adjusted under 35 U.S.C. 154(b) by 1005 days.

(21) Appl. No.: 14/052,418

(22) Filed: Oct. 11, 2013

(65) Prior Publication Data

US 2014/0107823 A1    Apr. 17, 2014

Related U.S. Application Data

(60) Provisional application No. 61/712,723, filed on Oct. 11, 2012.

(51) Int. Cl.
| | |
|---|---|
| *G06G 7/48* | (2006.01) |
| *G06F 17/50* | (2006.01) |
| *B29C 67/00* | (2017.01) |
| *B22F 3/00* | (2006.01) |
| *B22F 3/105* | (2006.01) |

(52) U.S. Cl.
CPC .............. *G06F 17/50* (2013.01); *B22F 3/008* (2013.01); *B29C 67/0059* (2013.01); *B29C 67/0088* (2013.01); *B22F 2003/1057* (2013.01); *Y02P 10/295* (2015.11)

(58) Field of Classification Search
CPC ....................................................... G06F 17/50

USPC ............................................................ 703/6
See application file for complete search history.

(56) References Cited

U.S. PATENT DOCUMENTS 6,813,594 B2 * 11/2004 Guertin ............... B29C 67/0092
118/620

OTHER PUBLICATIONS

Hilton, P. et al. 2000. Rapid tooling: technologies and industrial applications. CRC, pp. 78-84.
Lynn-Charney, C. et al. 2000. Usage of accuracy models in stereolithography process planning, Rapid Prototyping Journal, vol. 6, No. 2, pp. 77-87.

(Continued)

*Primary Examiner* — Hugh Jones
(74) *Attorney, Agent, or Firm* — Snell & Wilmer L.L.P.

(57) ABSTRACT

Errors caused by shrinkage during 3D printing may be minimized. A shape that most closely corresponds to the shape of a layer to be printed may be selected from a library of shapes. Each shape in the library may have shrinkage information associated with it that includes, for each of multiple points that define a perimeter of the library shape, a radial distance to the point from an origin of a coordinate system, an angle the radial distance makes with respect to an axis of the coordinate system, and information indicative of an anticipated amount by which the point will deviate from its specified location when the shape is printed due to shrinkage. Compensation for anticipated shrinkage may be calculated based on the shrinkage information that is associated with the selected shape from the library. The information indicative of the shape of the layer to be printed may be modified to minimize errors cause by shrinkage based on the calculated compensation.

10 Claims, 10 Drawing Sheets

(56) References Cited

OTHER PUBLICATIONS

Onuh, S. et al. 2001. Improving stereolithography part accuracy for industrial applications, The International Journal of Advanced Manufacturing Technology, vol. 17, No. 1, pp. 61-68.

Tang, Y. et al. 2004. Stereolithography cure modeling and simulation, International Journal of Materials and Product Technology, vol. 21, No. 4, pp. 255-272.

Tong, K. et al. 2003. Parametric error modeling and software error compensation for rapid prototyping, Rapid Prototyping Journal, vol. 9, No. 5, pp. 301-313.

Tong, K. et al. 2008. Error compensation for fused deposition modeling (FDM) machine by correcting slice files, Rapid Prototyping Journal, vol. 14, No. 1, pp. 4-14.

Wang, W. et al. 1996. Influence of process parameters on stereolithography part shrinkage, Materials & Design, vol. 17, No. 4, pp. 205-213.

Wang, X. 1999. Calibration of shrinkage and beam offset in SLS process, Rapid Prototyping Journal, vol. 5, No. 3, pp. 129-133.

Zhou, J. et al. 2000. Parametric process optimization to improve the accuracy of rapid prototyped stereolithography parts, International Journal of Machine Tools and Manufacture, vol. 40, No. 3, pp. 363-379.

\* cited by examiner $r_0(\theta) = 2(1 - \sin\theta\cos\theta)$ $$r_0(\theta) = 2(1 - \sin(0.5\theta))$$

3D PRINTING SHRINKAGE COMPENSATION USING RADIAL AND ANGULAR LAYER PERIMETER POINT INFORMATION

CROSS-REFERENCE TO RELATED APPLICATION

This application is based upon and claims priority to U.S. provisional patent application 61/712,723, entitled "Algorithm of Compensating Shape Shrinkage for 3D Printing Processes," filed Oct. 11, 2012. The entire content of this application is incorporated herein by reference.

STATEMENT REGARDING FEDERALLY SPONSORED RESEARCH

This invention was made with government support under Grant No. N00014-1110671, awarded by the Office of Naval Research. The government has certain rights in the invention.

BACKGROUND

Technical Field

This disclosure relates to additive layer 3D printing, including compensating for errors caused by shrinkage during material phase changes.

Description of Related Art

Additive manufacturing, or 3D printing, refers to a class of technologies for the direct fabrication of physical products from a 3D CAD model by a layered manufacturing process. In contrast to material removal processes in traditional machining, the 3D printing process adds material layer by layer to construct products. This technique can enable the direct printing of products with extremely complex geometry. Geometric complexity may not affect building efficiency, and so no extra effort may be necessary for molding construction or fixture tooling design. This can make 3D printing a promising manufacturing technique. See I. Gibson, D. Rosen, and B. Stucker, Additive manufacturing technologies: rapid proto-typing to direct digital manufacturing, Springer Verlag, 2009; P. Hilton and P. Jacobs, Rapid tooling: technologies and industrial applications, CRC, 2000; F. Melchels, J. Feijen, and D. Grijpma, "A review on stereolithography and its applications in biomedical engineering," Biomaterials, vol. 31, no. 24, pp. 6121-6130, 2010; T. Campbell, C. Williams, O. Ivanova, and B. Garrett, "Could 3d printing change the world? technologies, potential, and implications of additive manufacturing," 2011.

Despite these promising features, dimensional accuracy control can remain a bottleneck for application of 3D printing in direct manufacturing. Material solidification can be involved during layer formation, and this phase change from liquid to solid can lead to shape shrinkage and hence shape inaccuracy. See W. Wang, C. Cheah, J. Fuh, and L. Lu, "Influence of process parameters on stereolithography part shrinkage," Materials & Design, vol. 17, no. 4, pp. 205-213, 1996. Shrinkage control may thus be crucial to overcome the barrier of dimensional accuracy in 3D printing.

To predict the final product shape in 3D printing, finite element analysis (FEA) can be employed, for example, to simulate the structural shrinkage using a linear elastic model, see G. Bugeda, M. Cervera, G. Lombera, and E. Onate, "Numerical analysis of stereolithography processes using the finite element method," Rapid Prototyping Journal, vol. 1, no. 2, pp. 13-23, 1995), or the complete photo-polymerization, mass, and heat transfer process through a comprehensive kinetic model, see Y. Tang, C. Henderson, J. Muzzy, and D. Rosen, "Stereolithography cure modeling and simulation," International Journal of Materials and Product Technology, vol. 21, no. 4, pp. 255-272, 2004. However, the FEA method may be limited by inadequate physical understanding, and a trade-off between accuracy and computational complexity. In addition, a large number of model parameters can be difficult to acquire accurately in practice and model complexity can reduce its practicality in direct and efficient control of shape accuracy.

Empirical models have also been developed to reduce shrinkage through optimization of process parameters such as light intensity, exposure time, and layer thickness. Response surface modeling was adopted to optimize shrinkage at different directions, see J. Zhou, D. Herscovici, and C. Chen, "Parametric process optimization to improve the accuracy of rapid prototyped stereolithography parts," International Journal of Machine Tools and Manufacture, vol. 40, no. 3, pp. 363-379, 2000, or to optimize building parameters to achieve the trade-off between accuracy, building speed, and surface finish, see C. Lynn-Charney and D. Rosen, "Usage of accuracy models in stereolithography process planning," Rapid Prototyping Journal, vol. 6, no. 2, pp. 77-87, 2000. Designed experiments were used in S. Onuh and K. Hon, "Improving stereolithography part accuracy for industrial applications," The International Journal of Advanced Manufacturing Technology, vol. 17, no. 1, pp. 61-68, 2001, to decrease distortion and increase flatness. However this approach may only control or reduce average shape shrinkage.

To control detailed features along the boundary of the printed product, Tong et al., K. Tong, S. Joshi, and E. Lehtihet, "Error compensation for fused deposition modeling (fdm) machine by correcting slice files," Rapid Prototyping Journal, vol. 14, no. 1, pp. 4-14, 2008; and K. Tong, E. Lehtihet, and S. Joshi, "Parametric error modeling and software error compensation for rapid prototyping," Rapid Prototyping Journal, vol. 9, no. 5, pp. 301-313, 2003, changed the CAD design to compensate for shrinkage, and used polynomial regression models to analyze the shrinkage in X, Y, and Z directions separately. However, prediction of deformation based on the shift of individual points can be independent of the geometry of the product, which may not be consistent with the physical manufacturing process.

To summarize, part shape deformation due to material shrinkage has long been studied, e.g., in casting and injection molding processes. Strategies and methods that have been developed to pre-scale design parts for shrinkage compensation can be classified as follows:

Machine calibration through building test parts: Similar to the calibration of CNC machines, the AM machine accuracy in x, y, z directions can be calibrated through building test cases, see K. Tong, S. Joshi, and E. Lehtihet, "Error compensation for fused deposition modeling (fdm) machine by correcting slice files," Rapid Prototyping Journal, vol. 14, no. 1, pp. 4-14, 2008; K. Tong, E. Lehtihet, and S. Joshi, "Parametric error modeling and software error compensation for rapid prototyping," Rapid Prototyping Journal, vol. 9, no. 5, pp. 301-313, 2003; X. Wang, "Calibration of shrinkage and beam offset in sls process," Rapid Prototyping Journal, vol. 5, no. 3, pp. 129-133, 1999, and the dimensional accuracy of AM products is anticipated to be ensured during full production. However, the position of AM light exposure may not play the same dominant role as the tool tip position of CNC machines. As previously mentioned, part geometry and shape, process planning, materials, and processing techniques jointly can have complex effects on the profile accuracy. The calibration of the AM machine can therefore mostly be limited to the scope of a family of products, specific types of material and machine, and process planning methods.

Part geometry calibration through extensive trial-build: Besides machine calibration, another strategy is to apply either a shrinkage compensation factor uniformly to the entire product or different factors to the CAD design for each section of a product, see P. Hilton and P. Jacobs, Rapid tooling: technologies and industrial applications, CRC, 2000. However, it can be time-consuming to establish a library of compensation factors for all part shapes. The library may therefore not be inclusive. In addition, interactions between different shapes or sections may not be considered in this approach. Preliminary research shows that the strategy of applying section-wise compensation may have detrimental effects on overall shape due to "carryover effects" or interference between adjacent sections.

Simulation study based on first principles: Theoretical models for predicting shrinkage could potentially reduce experimental efforts. Models have been developed, e.g., in a powder sintering process, B. Storakers, N. Fleck, and R. McMeeking, "The viscoplastic compaction of composite powders," Journal of the Mechanics and Physics of Solids, vol. 47, pp. 785-815, 1999; J. Secondi, "Modeling powder compaction from a pressure-density law to continuum mechanics," Powder Metallurgy, vol. 45, no. 3, pp. 213-217, 2002, and in metal injection molding, see K. Mori, K. Osakada, and S. Takaoka, "Simplified three-dimensional simulation of non-isothermal filling in metal injection moulding by the finite element method," Engineering Computations, vol. 13, no. 2, pp. 111-121, 1996. Although numerical FEM simulation can be developed to calculate the impact of shrinkage compensation, three-dimensional deformations and distortions in AM processes can still be rather complicated. Improving part accuracy based purely on such simulation approaches can be far from effective, and may seldom be used in practice, see D. L. Bourell, M. C. Leu, and D. W. Rosen, "Roadmap for additive manufacturing: Identifying the future of freeform processing," Sponsored by National Science Foundation and the Office of Naval Research, Tech. Rep., 2009.

Experimental calibration strategy and first-principles-based simulation analysis both aim to control part deformation through process design. However, these strategies may fail to achieve high-precision geometric accuracy both prior to and during production. Additionally, process uncertainties may further complicate the issue of error control.

SUMMARY

A data processing system may minimize errors caused by material phase change shrinkage during additive layer 3D printing. Information indicative of the shape of a layer of a 3D object that is to be printed may be received. A shape that most closely corresponds to the shape of the layer may be selected from a library of shapes. Each shape in the library may have shrinkage information associated with it that includes, for each of multiple points that define a perimeter of the library shape, a radial distance to the point from an origin of a coordinate system, an angle the radial distance makes with respect to an axis of the coordinate system, and information indicative of an anticipated amount by which the point will deviate from its specified location when the shape is printed due to shrinkage. The closeness between two shapes may be measured by the $L\_2$ distance between the multiple points on the perimeters of two shapes. Compensation for anticipated shrinkage of the layer when printed may be calculated based on the shrinkage information that is associated with the selected shape from the library. The information indicative of the shape of the layer to be printed may be modified to minimize errors cause by shrinkage of the layer when printed based on the calculated compensation.

After the layer is printed using the selected shape with the modified shape information, error information from a user indicative of one or more size errors in the layer caused by shrinkage may be received. A new shape that is closer to the shape of the layer than the selected shape may be created and added to the library based on the selected shape and the error information from the user.

The shrinkage information in the library with the new shape may include, for each of multiple points that define a perimeter of the new shape, a radial distance to the point from an origin of a coordinate system, an angle the radial distance makes with respect to an axis of the coordinate system, and information indicative of an anticipated amount by which the point will deviate from its specified location when the shape is printed due to shrinkage.

The radial distances of at least one shape in the library may not all have a common origin. For each common origin, however, there may only be a single point at each angle.

The shrinkage information for at least one of the points in at least one of the shapes in the library may include a location-dependent and a location-independent component.

Calculating compensation for anticipated shrinkage may include computing a Taylor series expansion of the shrinkage information that is associated with the selected shape from the library.

Calculating compensation for anticipated shrinkage may include calculating compensation for each point in the selected shape. A deviation may be determined between each point that defines a perimeter of the selected shape and a corresponding point on the to-be-printed layer. For each point that defines a perimeter of the selected library shape, the information of the anticipated amount by which the point will deviate from its specified location may be adjusted to include the determined deviation between the point and the corresponding point on the to-be-printed layer.

A non-transitory, tangible, computer-readable storage medium containing a program of instructions may cause a computer system running the program of instructions to implement all or any sub-combination of the functions of the data processing system that are described herein.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

Overview

Systematic models for accuracy control through shrinkage compensation are now described. The approach may: (1) model and predict part shrinkage, and (2) derive an optimal shrinkage compensation plan to achieve dimensional accuracy. The approach has been demonstrated both analytically and experimentally in a stereo-lithography process, a widely employed 3D printing technique. Experimental results demonstrate the ability of the compensation approach to achieve an improvement of one order of magnitude in reduction of geometric errors for cylindrical products.

A shape error control strategy that may be applicable to both calibration and production is now described.

A common issue faced in two different stages of additive manufacturing (AM) is, given the observed geometric errors of built parts with complex shapes, how to substantially improve geometric shape accuracy thereafter.

A strategy to dramatically reduce shape deviations may be to adjust CAD input through compensation.

Figure 1:
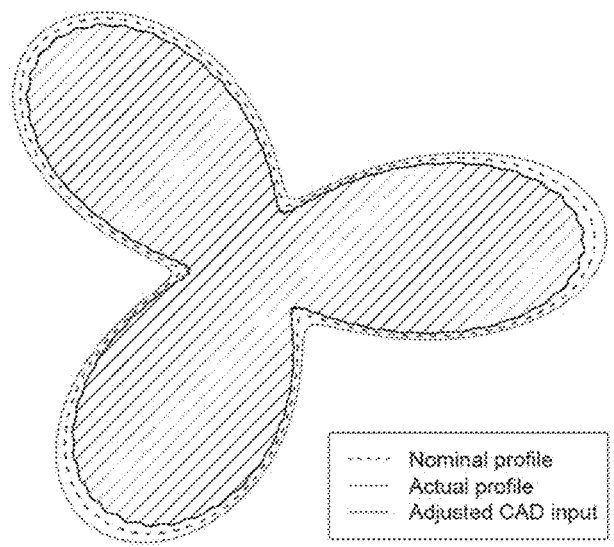
FIG. 1 illustrates an example of an adjustment to a CAD design that may be employed to reduce errors caused by layer shrinkage.

FIG. 1 illustrates an example of an adjustment to a CAD design that may be employed to reduce errors caused by layer shrinkage. An optimal amount of compensation for reducing devotion at each point on the product boundary for high-precision AM may be derived. This strategy may better accommodate more complex shapes and achieve much higher precision.

The strategy may have the ability to learn from previously tested shapes to derive compensation plans from a set of basic shape elements. The strategy might have limited use if the compensation experiment interrupts production each time a new product shape is introduced. On the other hand, establishing an extensive library before production may not be economical and practical due to the nature of AM for complex geometries. A set of basis shape elements that can be used to derive, at the very least, a sub-optimal compensation plan for a new product shape before experimentation may be identified and tested. Once the shape deviation is observed, a model learning capability may be used for further enhancements and/or for improving future prediction.

To summarize, the shrinkage error strategy may have one or more of the following features:

System-level strategy: A system-level issue of geometric error reduction that is not limited to specific CAD design and process planning methods, product materials, or AM processes. In addition, the methods can be applied both prior to production for calibration, and during production for process control.

High-precision strategy: Instead of applying section-to-section compensation factors, the strategy can derive continuous point-to-point compensation plans to reduce boundary shrinkage of complex shapes for high-precision built parts.

Smart compensation strategy: Instead of establishing an extensive calibration library, the strategy can learn from previously tested shapes and derive compensation plans from a set of basis shape elements.

Shrinkage Representation and
Modeling—Transformation of Geometric Shapes into Profiles This section describes a unified formulation of geometric shape errors due to shrinkage. This formulation may facilitate description of the profiles or contours of any given complex shape, derivations of closed-form solutions of optimal compensation to reduce shape deviations, as well as inferences on the prediction and compensation of untested shapes from a designed library of tested cases.

The formulation of geometric part errors may dictate the development of analysis approaches. A shape-dependent formulation may lead to a shape-dependent shrinkage compensation approach, which might restrict learning and extrapolating from tested cases. Since AM built-parts may have complex shapes, a generic, shape-independent description of geometric part errors has been derived.

Shrinkage Representation

The shape may be transformed from a cartesian coordinates system to profiles in a polar coordinates system (PCS). Suppose a product has an intended shape $\psi_0$ and actual shape ψ. Shrinkage can be described as Δψ=ψ−ψ$_0$, where the shape ψ and its deviation in the PCS using (r, θ, z) is characterized.

Figure 2:
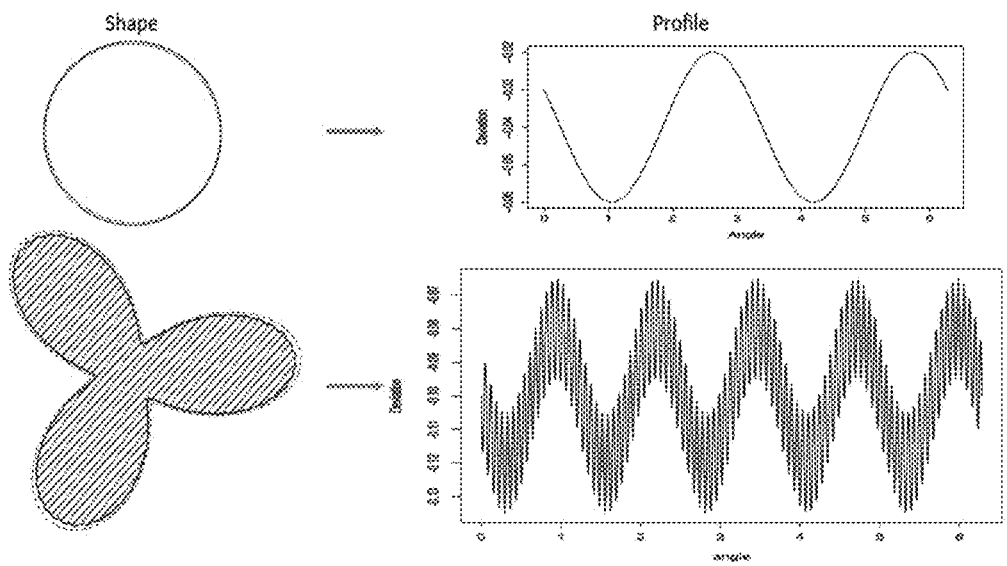
FIG. 2 illustrates examples of transforming two shapes to deviation profiles in a polar coordinates system (PCS).

FIG. 2 illustrates examples of transforming two shapes to deviation profiles in a polar coordinates system (PCS). As illustrated in FIG. 2, once the shape deviations Δψ are presented in the PCS as deviation profiles, modeling and analysis of geometric part errors are greatly alleviated from the original geometric complexity.

This approach entailed two steps: (1) transforming complex shapes to profiles, and (2) modeling profiles in the PCS. The issues of transforming shapes to profiles is now discussed.

Univariate shapes: For product shapes like those in FIG. 2, the origin of the PCS may be located in such a way that, for any given angle θ, there is only one unique point with radius r(θ) on the product boundary. The transformed shape deviation in the PCS may be a single continuous profile defined on [0,2π]. This class of product shapes may be called univariate shapes, and the analysis may be related to univariate profile analysis.

Figure 3:
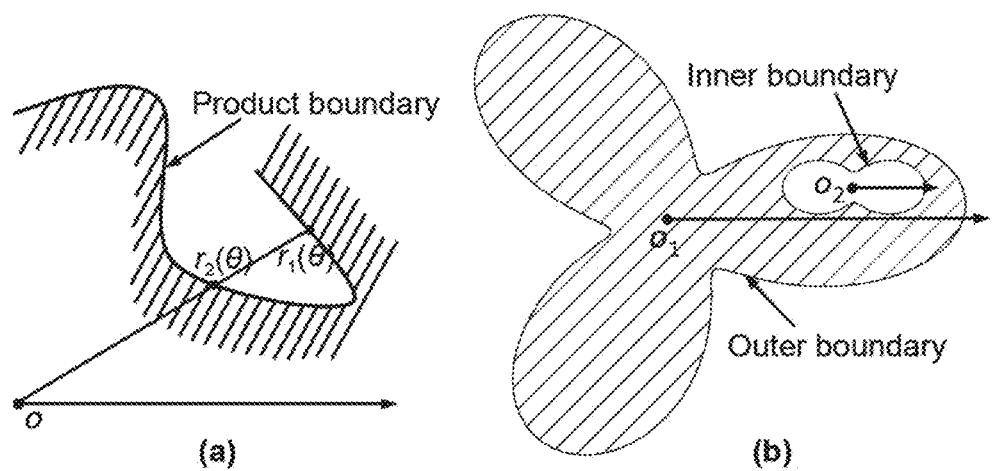
FIGS. 3A and 3B illustrate examples of multiple profiles and PCSs.

Multivariate shapes: FIGS. 3A and 3B illustrate examples of multiple profiles and PCSs. For more complex shapes, no matter how the PCS is translated and/or rotated, there may exist more than one point on the product boundary for a given angle θ, as illustrated in FIG. 3A. The multiple PCSs in which each profile is uniquely defined may be established. A special case shown in FIG. 3B is a product with outer and inner boundaries defined in two PCSs. These types of product shapes may be called multivariate shapes, and multivariate profile analysis may be relevant.

The transformation of multivariate shapes and an evaluatation of their impact on subsequent modeling and analysis has been investegated. Previous experience with univariate shapes suggests maintaining the consistency of PCSs during AM and inspection in order to define the shape deviations. Particularly, the origin of PCS$_1$, which may be associated with the largest boundary, may coincide with the center of the AM building platform. The distance from the boundary to the origin may be inherently linked with the lighting or energy source.

Figure 4A:
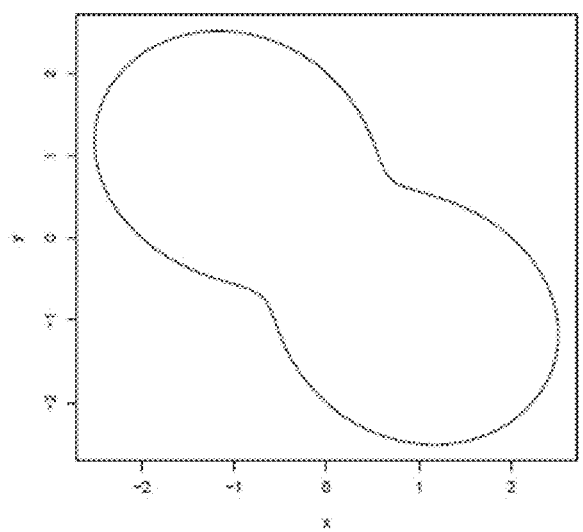
FIGS. 4A and 4B illustrate examples of shapes generated by different functional forms $r_0(\theta)$.
Figure 4B:
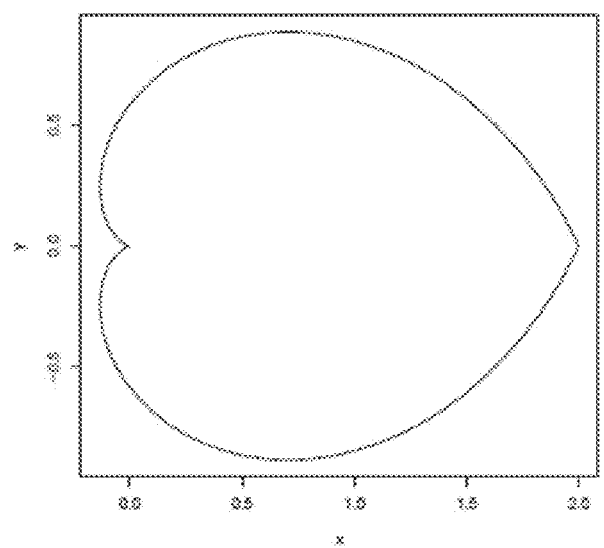

FIGS. 4A and 4B illustrate examples of shapes generated by different functional forms r$_0$(θ). For illustrative purposes, a two-dimensional definition of shrinkage is introduced. Under the assumption that the center is well-defined, the boundary of a two-dimensional shape can be represented by a function r$_0$(θ) denoting the nominal radius at angle θ. For example, the function r$_0$(θ)=r$_0$ for all θ may define a circle, and r$_0$(θ)=2(1−sin θ cos θ) and r$_0$(θ)=2(1−sin(0.5θ)) for 0≤θ≤2π may define the shapes in FIGS. 4A and 4B, respectively. The actual radius at angle θ may be a function of θ and r$_0$(θ) and may be expressed as r(θ, r$_0$(θ)). The difference between the actual and nominal radius at an angle θ may be essentially what defines the shrinkage Δψ at θ. Therefore, for a two-dimensional shape, shrinkage Δψ in the 3D printing process can be conveniently represented as $$\Delta r(\theta, r_0(\theta)) = r(\theta, r_0(\theta)) - r_0(\theta). \quad (1)$$

Like other manufacturing processes, the center of the product may coincide with the origin of the part coordinate system defined by CAD software. For the convenience of building and measuring parts, the center may be the origin of the machine or inspection coordinate system.

The aforementioned definition of shrinkage may be extended to three dimensions by introducing a variable z which represents the third coordinate. The nominal radius on the boundary may now be a function of θ and z, and can be represented by the function r$_0$ (θ, z).

Figure 5A:
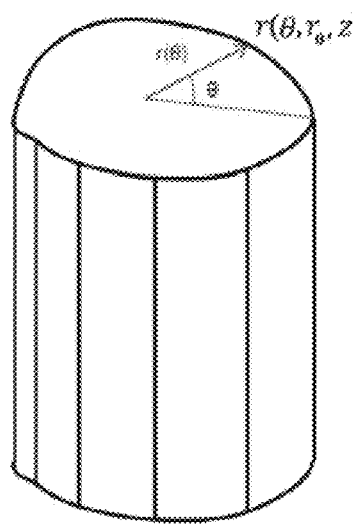
FIGS. 5A and 5B illustrate examples of shrinkage representation under a polar coordinate system.
Figure 5B:
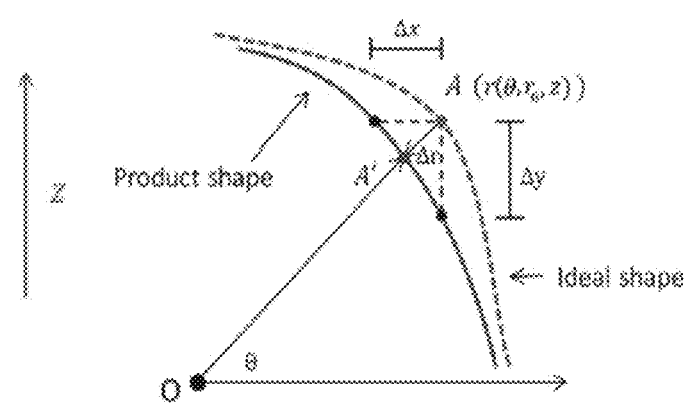

FIGS. 5A and 5B illustrate examples of shrinkage representation under a polar coordinate system. As shown in these figures, the shape ψ may now be specified by the function r(θ, r$_0$(θ, z), z) at the boundary, and the shrinkage can be represented as $$\Delta r(\theta, r_0(\theta), z) = r(\theta, r_0(\theta, z), z) - r_0(\theta, z). \quad (2)$$

Cartesian representation has been studied in literature, see K. Tong, S. Joshi, and E. Lehtihet, "Error compensation for fused deposition modeling (fdm) machine by correcting slice files", Rapid Prototyping Journal, vol. 14, no. 1, pp. 4-14, 2008; K. Tong, E. Lehtihet, and S. Joshi, "Parametric error modeling and software error compensation for rapid prototyping", Rapid Prototyping Journal, vol. 9, no. 5, pp. 301-313, 2003. A practical issue is to correctly identify shape deviation. As shown in FIG. 5B, for a given nominal point A(x, y, z), its final position A' may be difficult to identify after shrinkage.

A practical solution may be to fix the x or y coordinate and study the deviation of the other coordinate (Δx or Δy in FIG. 5B). The choice of either direction could lead to different shrinkage results. Another method may be to study shrinkage along three directions separately, see K. Tong, S. Joshi, and E. Lehtihet, "Error compensation for fused deposition modeling (fdm) machine by correcting slice files", Rapid Prototyping Journal, vol. 14, no. 1, pp. 4-14, 2008; K. Tong, E. Lehtihet, and S. Joshi, "Parametric error modeling and software error compensation for rapid prototyping", Rapid Prototyping Journal, vol. 9, no. 5, pp. 301-313, 2003. But the apparent correlation of shrinkage among the three directions may not be able to be captured, potentially leading to prediction error.

In contrast, the definition of radius deviation may capture shrinkage and may be convenient for visualizing shrinkage patterns.

Figure 6A:
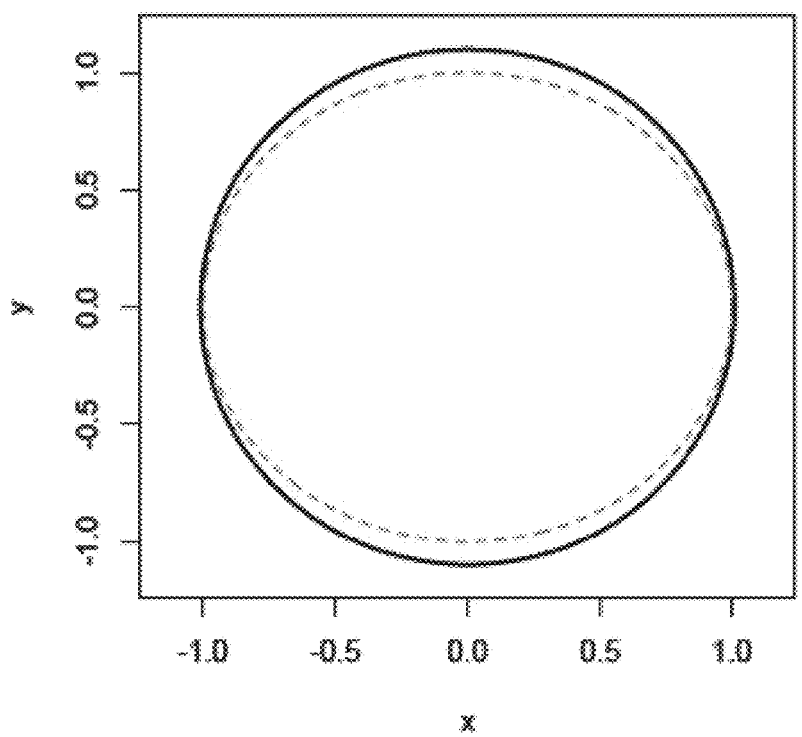
FIG. 6A illustrates an example of an ideal circular shape (solid-line) vs. an actual shape (dash-line).
Figure 6B:
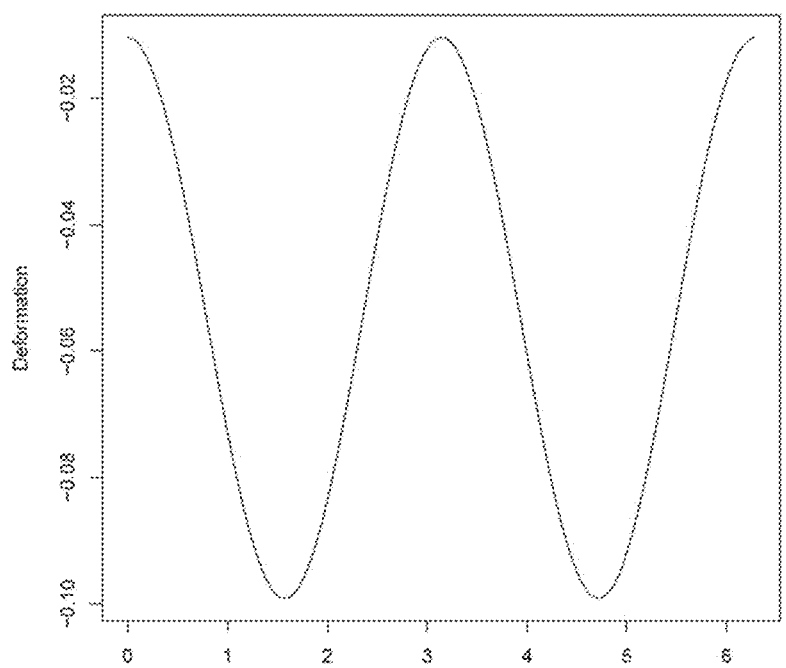
FIG. 6B illustrates an example of visualization of shrinkage patterns.

FIG. 6A illustrates an example of an ideal circular shape (solid-line) vs. an actual shape (dash-line). FIG. 6B illustrates an example of visualization of shrinkage patterns. For example, suppose the ideal shape is a perfect circle (solid-line in FIG. 6) and the final product's shape is an ellipse (dashed-line). Plotting the shrinkage at each angle may lead to a visualization of systematic spatial patterns (FIG. 6B) amenable to analysis. The essence of this representation may be to transform various geometric shapes into profiles so that a generic formulation of product shrinkage may be achieved. This transformation may help reduce the geometric complexity in the modeling of shape shrinkage.

Shrinkage Process Modeling

The geometric shape error formulation through transformation may imply the relevance of literature in functional data analysis. See J. Ramsay and B. W. Silverman, Functional Data Analysis. Springer, 2005, and profile monitoring, see O. Mestek, J. Pavlik, and M. Suchanek, "Multivariate control charts: control charts for calibration curves," Fresenius' journal of analytical chemistry, vol. 350, no. 6, pp. 344-351, 1994; W. Woodall, "Current research on profile monitoring," Prod., vol. 17, no. 3, pp. 420-425, 2007; J. R. Rosenblatt and C. H. Spiegelman, "Discussion of a bayesian analysis of the linear calibration problem by w. g. hunter and w. f. lamboy," Technometrics, vol. 23, pp. 329-333, 1981; L. Kang and S. Albin, "On-line monitoring when the process yields a linear profile," Journal of Quality Technology, vol. 32, no. 4, pp. 418-426, 2000; J. Jin and J. Shi, "Automatic feature extraction of waveform signals for in-process diagnostic performance improvement," Journal of Intelligent Manufacturing, vol. 12, no. 3, pp. 257-268, 2001; J. Williams, W. Woodall, and J. Birch, "Phase i monitoring of nonlinear profiles," in Quality and Productivity Research Conference, 2003; W. Woodall, D. Spitzner, D. Montgomery, and S. Gupta, "Using control charts to monitor process and product quality profiles," Journal of Quality Technology, vol. 36, no. 3, pp. 309-320, 2004. However, there may be major differences in research objectives:

Predictive vs. descriptive: For small-batch, high-precision AM processes, the ability to predict and control the accuracy of a given shape with various sizes, i.e., a family of products, may be more desirable than monitoring and control of one specific product.

Proactive vs. reactive: It may be critical to have a proactive approach to predict and control product accuracy for a new family of products by learning from tested families. Although after-fact correction due to prediction errors may still be needed, a proactive approach may dramatically shorten the cycle of accuracy control and process calibration.

These differences in the objective may lead to two aspects of modeling: (1) deviation profile modeling for a family of products after measurement, and (2) deviation profile modeling for a new family of products prior to production.

For a multivariate shape, denote by $f_i(\theta, r_0(\theta))$ the shape deviation profile defined in the ith $PCS_i$, i=1, 2, ..., m, with $r_0(\theta)$ representing the nominal/ideal value by design at angle $\theta$. If each profile is sampled at n angles, the total observed shape deviations may be:

$$[f_i(\theta, r_0(\theta))]_{m \times n}, i=1, \ldots, m. \quad (3)$$

To build predictive models, the physical understanding is incorporated into statistical models and decompose $f_i(\theta, r_0(\theta))$ into three components:

$$f_i(\theta, r_0(\theta))_{n \times 1} = f_{i,1}(V_i) + f_{i,2}(\theta, r_0(\theta)) + \epsilon_i(\theta) \cdot -6pt \quad (4)$$

where the function $f_{i,1}(V_i)$ represents average shrinkage of a shape with volume $V_i$ independent of location variable $\theta$, $f_{i,2}(\bullet,\bullet)$ is the location-dependent shrinkage, and $\epsilon_i(\theta)$ is noise term representing modeling error that often contains surface roughness in AM processes.

Methods therefore may include: (1) deriving suitable and general functional representations for $f_{i,1}(V_i)$ and $f_{i,2}(\bullet,\bullet)$, and (2) studying correlations among m deviation profiles through $\epsilon_i(\theta)$. The overall strategy for deriving $f_{i,1}(V_i)$ and $f_{i,2}(\bullet,\bullet)$ may involve statistical modeling using geometrical and physical insights as now discussed.

Volumetric change for $f_{i,1}(V_i)$: Geometrically, the area or volume of a shape may be obtained by integrating $r_0(\theta)$ over the space of $\theta$, eliminating the location-dependent variable $\theta$. Physically, $f_{i,1}(V_i)$ may describe the volumetric shrinkage of the ith shape, and derive $f_{i,1}(V_i)$ may be derived by reasonably assuming $\Delta V_i \propto V_i$. For example, the cylindrical shape has $[\pi(r_0+\Delta r)^2 h - \pi r_0^2 h] \propto \pi r_0^2 h$, which leads to $f_i(V) \propto r_0$. A similar derivation for the cubical shape yields $f_1(V) \propto s_0$, the length of each side of the square. This can be viewed as the base physical mode for each shape.

Physical mode decomposition of $f_{i,2}(\theta, r_0(\theta))$: The location-dependent term $f_{i,2}(\theta, r_0(\theta))$ is geometrically related to $r_0(\theta)$, the distance from the center of building platform to the boundary. In order to accommodate shape complexity, the idea of empirical mode decomposition from N. E. Huang, Z. Shen, S. R. Long, M. C. Wu, H. H. Shih, Q. Zheng, N.-C. Yen, C. C. Tung, and H. H. Liu, "The empirical mode decomposition and the hilbert spectrum for nonlinear and non-stationary time series analysis," Proc. R. Soc. Lond. A, vol. 454, no. 1971, pp. 903-995, 1998, is borrowed.

Although the patterns of $f_{i,2}(\bullet,\bullet)$ can be highly dependent on specific processes, the modes with a physical interpretation is to be justified. Below the method using the SLA experiment on cylinders, is demonstrated.

A goal may be to change the CAD input $r_0(\theta, z)$ to compensate for product shrinkage. Therefore, the shrinkage process may be modeled to understand the functional dependence of shrinkage $\Delta r(\theta, r_0(\theta, z), z)$ on $\theta$, z, and the nominal radius $r_0(\theta, z)$. For notational convenience, this function by $f(\theta, r_0(\theta, z), z)$ is denoted. If the in-plane (x-y) shrinkage error is of primary interest (as is the case in this study), coordinate z may be ignored. Consequently, as in (1), in the subsequent discussion the shrinkage by the function $f(\theta, r_0(\theta))$ is represented.

Note that compensation applied through changes to the CAD model assumes that process building parameters (e.g., light intensity) are optimized, in the sense that the average shrinkage is more or less under control, and close to target. The local geometric accuracy is therefore of major concern. With this in mind, the process shrinkage function $f(\theta, r_0(\theta))$ may be further decomposed into three components:

$$f(\theta, r_0(\theta)) = f_1(\psi) + f_2(\theta, r_0(\theta)) + \epsilon_\theta. \quad (5)$$

The three components of the above equation may be defined and interpreted as follows:

1. Function $f_1(\psi)$ represents average shrinkage or trend independent of location variable $\theta$, and is constant for a given shape $\psi$. Geometrically, the area or volume of a shape is obtained by integrating $r_0(\theta)$ over the space of $\theta$, eliminating the location-dependent variable $\theta$. Physically, it describes the uniform shrinkage for the 3D printing process. As stated before, shrinkage may be caused both by the phase change of resin and temperature changes before and after the exothermic photopolymerization reaction. The overall or average shrinkage can be related to the volumetric change of the product.

2. Function $f_2(\theta, r_0(\theta))$ is the location-dependent shrinkage in addition to the trend. Following the same reasoning as above, this location-dependent term is geometrically and physically related to $r_0(\theta)$.

3. Term $\epsilon_\theta$ represents high frequency components that add on to the main harmonic trend.

$f_1(\bullet)$ may be interpreted as a lower order term and $f_2(\bullet,\bullet)$ as a higher order component of the shrinkage function.

The cylinder example in FIG. 6 is a demonstration of model (5). In this example, $r_0(\theta) = r_0$ for all $\theta$, so $f_1(\bullet)$ is a function of $r_0$ only, and $f_2(\bullet,\bullet)$ is a function of both $r_0$ and $\theta$. Decomposition of shrinkage into lower and higher order terms reduces equation (5) to the following form:

$$f(\theta, r_0(\theta)) = c + \sum_k \{a_k \cos(k\theta) + b_k \sin(k\theta)\} + \varepsilon_\theta \quad (6)$$

where $f_1(\psi) = c$, and $\{a_k\}$, $\{b_k\}$ are coefficients of a Fourier series expansion of $f_2(\bullet,\bullet)$. Note that c, $\{a_k\}$, and $\{b_k\}$ are functions of $r_0$. Among the coefficients $\{a_k\}$ and $\{b_k\}$ in the Fourier series, terms with small k represent low-frequency geometric change, while high-frequency terms represent the surface roughness of the product, which is not the primary issue at the present stage.

Compensation Modeling and Prediction Based on Profile Modeling

One aim may be to reduce shrinkage of manufactured products by direct compensation to the CAD model. Specifically, the revision of the CAD model according to predictions of shrinkage, obtained through an understanding of the effect of compensation to the boundary of the CAD model. Under the polar coordinates system, a compensation of $x(\theta)$ units at location $\theta$ can be represented as an extension of the product's radius by $x(\theta)$ units in that specific direction $\theta$. An optimal compensation function may be wanted that results in elimination of systematic shrinkage at all angles. To obtain such a function, model (5) may be extended to accommodate the effect of compensation.

The notation in equation (1) may be generalized as follows: let $r(\theta, r_0(\theta), x(\theta))$ denote the actual radius at angle $\theta$ when compensation $x(\theta)$ is applied at that location. Assuming that the dynamics of the manufacturing and shrinkage processes remain the same under compensation as compared to the entire process without compensation, and noting that the nominal radius at angle $\theta$ with a compensation of $x(\theta)$ is $r_0(\theta)+x(\theta)$, one can write:

$$r(\theta, r_0(\theta), x(\theta)) - (r_0(\theta) + x(\theta)) = f(\theta, r_0(\theta) + x(\theta)),$$

where $f(\cdot, \cdot)$ is given by (5). Consequently, the shrinkage at an angle $\theta$ is $$\Delta r(\theta, r_0(\theta), x(\theta)) = r(\theta, r_0(\theta), x(\theta)) - r_0(\theta) \quad (7)$$

$$= f(\theta, r_0(\theta) + x(\theta)) + x(\theta).$$

Note that $f(\theta, r_0(\theta))$ defined earlier equals $f(\theta, r_0(\theta)+0)+0$, and $\Delta r(\theta, r_0(\theta))$ is $\Delta r(\theta, r_0(\theta), 0)$ here. 3D printing scenarios may have compensation $x$ relatively small in comparison to the nominal radius $r_0(\theta)$ (normally 1% to 2%), and so this model can be simplified by a first order approximation of $E[\Delta r(\theta, r_0(\theta), x(\theta))|\theta]$ at each location $\theta$ and keeping the first and second terms of the Taylor expansion at point $r_0(\theta)$. Defining $g(\cdot, \cdot) = E[f(\cdot, \cdot)|\theta]$, the result from (7) is that $$E[\Delta r(\theta, r_0(\theta), x(\theta))|\theta] = g(\theta, r_0(\theta) + x(\theta)) + x(\theta) \quad (8)$$

$$\approx g(\theta, r_0(\theta)) + g'(\theta, r_0(\theta))x(\theta) + x(\theta).$$

where $g'(\theta, r_0(\theta))$ is the derivative with respect to $r_0(\theta)$.

The shrinkage model when no compensation is applied may be a special case of (8) when $x(\theta)=0$ for all $\theta$. Equating $E[\Delta r(\theta, r_0(\theta), x(\theta))|\theta]$ to zero, the optimal compensation function $x^*(\theta)$ can be obtained as $$x^*(\theta) = -\frac{g(\theta, r_0(\theta))}{1 + g'(\theta, r_0(\theta))}. \quad (9)$$

Smart shape-to-shape control strategy with learning capability: For products with untested shapes, it may be a daunting task to develop a smart shape-to-shape control strategy through learning from a designed library of previously tested cases. There may be the method of deriving shapes through compensation. This strategy builds upon the understanding of shape shrinkage, the effect of compensation, and interference.

Figure 7:
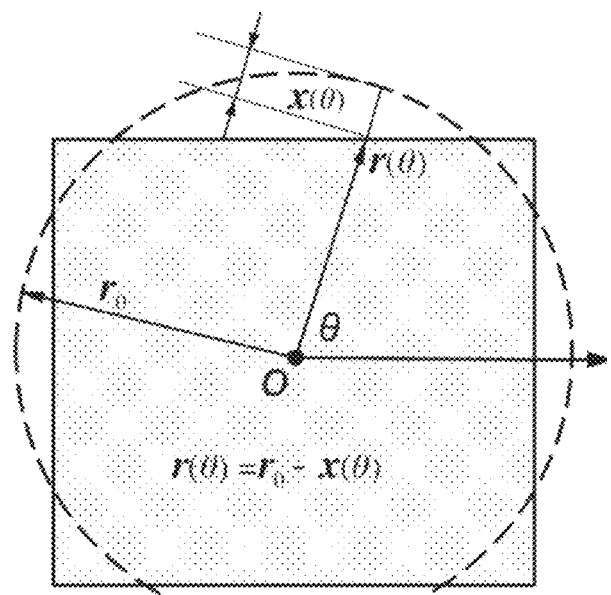
FIG. 7 illustrates an example of shape-to-shape control.

FIG. 7 illustrates an example of shape-to-shape control. As illustrated in FIG. 7, the shrinkage of an "untested" square shape may be predicted, given the tested case of a cylindrical shape. The square shape may be viewed as generated through compensation to a cylinder or $r(\theta)=r_0-x$ ($\theta$). The choice of PCS origin, radius of the cylinder $r_0$, and interference evaluation may influence the accuracy.

Figure 8:
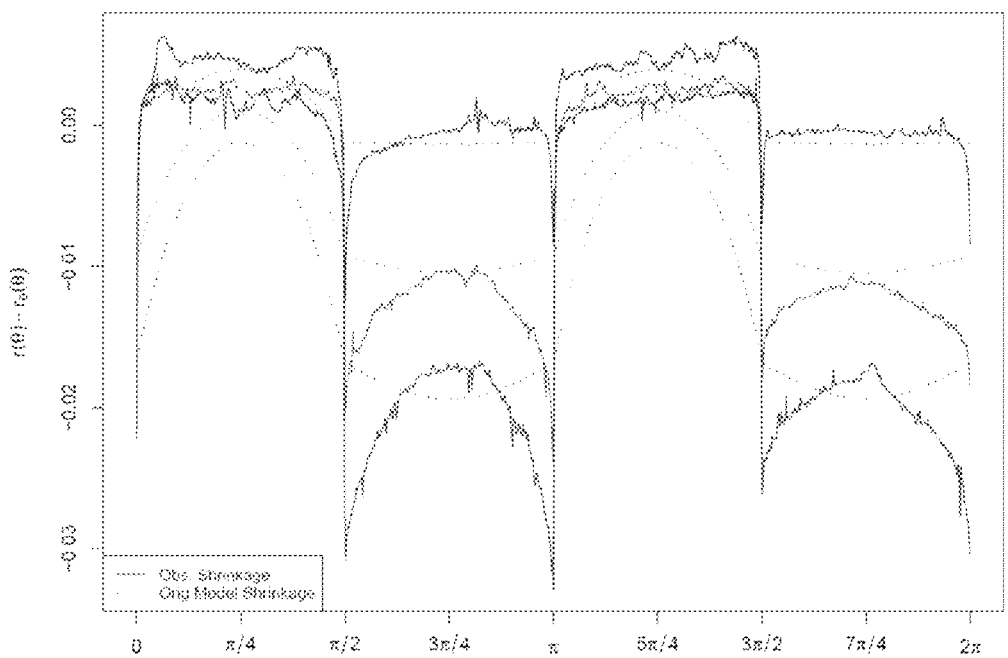
FIG. 8 illustrates an example of learning from cylinder to predict square shapes.

FIG. 8 illustrates an example of learning from cylinder to predict square shapes. FIG. 8 shows the prediction of square shape shrinkage (dashed curves) based on the cylindrical shape model (without radius optimization and interference). With only one learning case, prediction may not achieve a high level of accuracy. However, compared to the case without learning capability, a smart control strategy may still achieve a reasonable improvement and the improvement may be expected to dramatically increase with the number of tested cases and improved understanding of process physics. With a designed library of tested cases, this may be a promising pathway to accomplish smart shape-to-shape control.

Shrinkage Modeling and Compensation for Cylinders—Methodology Demonstration

The general modeling and compensation strategy can be applied to a cylinder product. In the section above on Shrinkage Process Modeling, it was noted that $r_0(\theta)=r_0$ for all $\theta$ for the cylinder, and proposed decomposition model (6) for $f(\theta, r_0)$. Several physical experiments were conducted to fit a reasonable, parsimonious decomposition model using harmonic terms in (6) that make significant contributions. The 3D printing technique may be used to construct the products, and then construct the shrinkage model for cylinders using measurement data from the experiments.

Manufacturing Process

Figure 9:
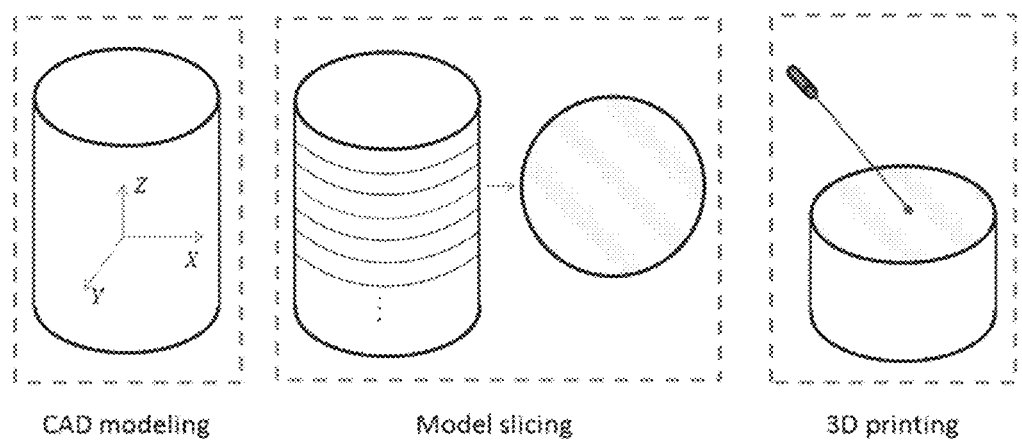
FIG. 9 illustrates an example of a generalized procedure for 3D printing.

FIG. 9 illustrates an example of a generalized procedure for 3D printing. A 3D model may first be built in a computer by CAD software. Next, a specialized program may slice the CAD model into several cross sections (STL format files) according to a predesignated thickness of each layer, so that a 3D printing machine can construct each layer sequentially.

Each layer's construction may be analogous to printing of an image with a particular thickness, explaining this technique's name. After all layers have been printed, the final product may have the same dimension as the original CAD model.

Stereolithography (SLA) is a commercialized technique for 3D printing. See P. Jacobs, Rapid prototyping & manufacturing: fundamentals stereolithography, Sme, 1992. The methodology using a variant of the SLA process is demostrated, Mask Image Projection SLA (MIP-SLA).

Figure 10:
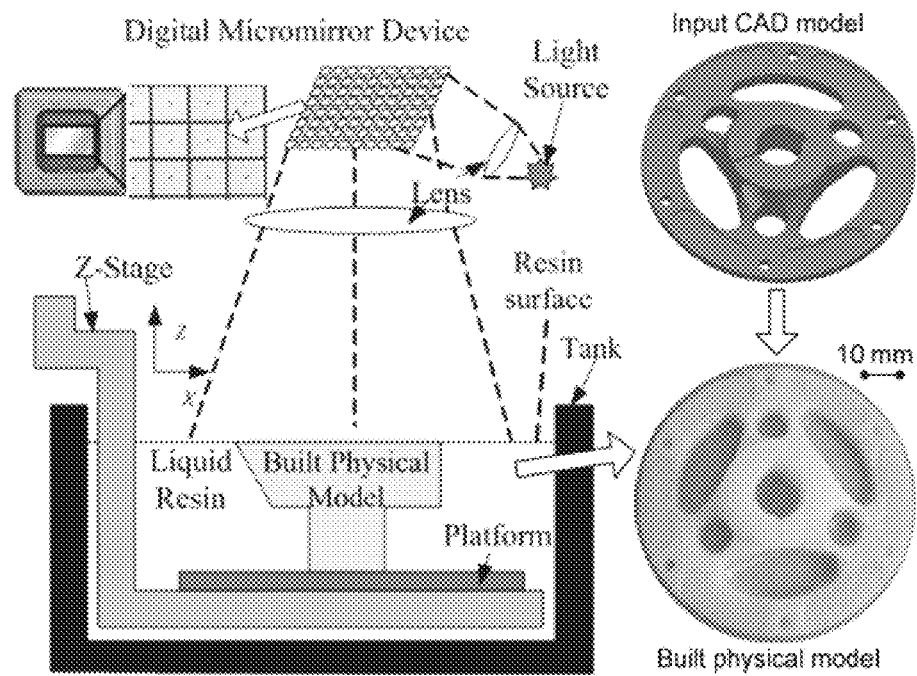
FIG. 10 illustrates an example of a mask projection SLA process.

FIG. 10 illustrates an example of a mask projection SLA process. An MIP-SLA machine may have liquid resin stored in a tank configured with a platform that can move vertically precisely. During the printing process, the surface of the resin may be exposed to light, which may trigger the resin solidification. Control of light exposure area and intensity may be through a digital micromirror device (DMD) that receives commands from STL files for each layer. The platform in the tank may move down with the predefined thickness for printing the next layer after the previous layer is solidified.

A commercial MIP-SLA platform, the ULTRA machine from EnvisionTec, was used to conduct experiments. Specifications of the manufacturing process are shown below in Table 1.

TABLE 1

Specific parameters of MP-SLA process

| | |
|---|---|
| Height of the product | 0.5" |
| Thickness of each layer | 0.004" |
| Resolution of the mask | 1920 * 1200 |
| Dimension of each pixel | 0.005" |
| Illuminating time of each layer | 9 s |
| Waiting time between layers | 15 s |
| Type of the resin | SI500 |

When the manufacturing process was complete, the upper boundary of the final product was measured by the Micro-Vu vertex measuring center, and the measurement data was converted to polar coordinates for shrinkage modeling.

Four cylinders of radius $r_0$=0.5", 1", 2", and 3" were manufactured and measured according to the procedure described above.

Figure 11:
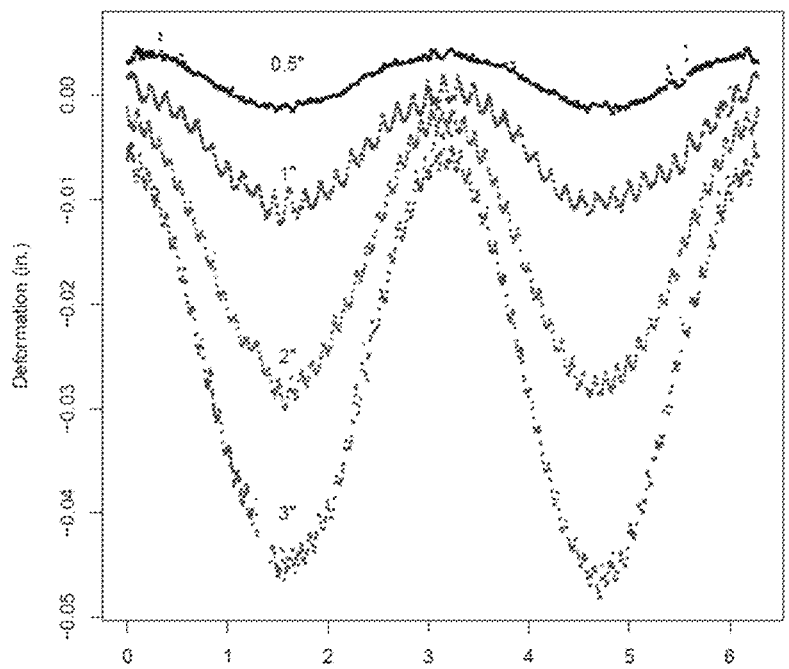
FIG. 11 illustrates an example of shrinkages for $r_0$=0.5", 1", 2", 3" with no compensation applied.

FIG. 11 illustrates shrinkages for $r_0$=0.5", 1", 2", 3" and with no compensation applied. The plot of the deformations for a sample of approximately 700 angles in each cylinder (each separated by approximately 0.01 radian) is displayed in FIG. 11.

Constructing the Model

The discussion above in the Shrinkage Process Modeling section, equation (6), and an observation of FIG. 11 (left panel) suggests the following functional form for shrinkage as a special case of equation (6):

$$f(\theta, r_0) = c_{r_0} + a_{r_0} \cos(2\theta) + \epsilon_\theta \quad (10)$$

for each cylinder of nominal radius $r_0$. Here, $\epsilon_\theta \sim N(0, \sigma^2)$ represents high frequency components adding on the main harmonic trend. When this model was fit, the finite subset of angles $\theta_1, \ldots, \theta_n$ for each cylinder as described above was used, which may have made the assumption regarding the independence of error terms more tenable if correlations among neighboring angles died out very quickly as a function of their separation (in radians). In consideration of the location-irrelevant model describing shrinkage by temperature and phase changes, the volumetric shrinkage should be proportional to the entire volume of the product based on the knowledge of heat transfer literature. Assuming that the height of the cylinder, h, in the z direction remains unchanged, the expected volumetric shrinkage is $$h\{(r_0 + \Delta r)^2 - r_0^2\} \propto h r_0^2.$$

The radial shrinkage $\Delta r$ is considerably less than the nominal radius $r_0$, leading to the approximation $\Delta r \propto r_0$. Thus, the model $$c_{r_0} = \alpha r_0^a$$

where the parameter a should be approximately 1. Similarly, the model $$a_{r_0} = \beta r_0^b$$

to describe the location-relevant deformation, with b also approximately 1 as well. To summarize, the first parametric shrinkage model considers fitting for a cylinder product is $$\Delta r(\theta, r_0) = \alpha r_0^a + \beta r_0^b \cos(2\theta) + \epsilon_\theta, \quad (11)$$

with $\alpha$, $\beta$, a, b, and $\sigma$ all independent of $r_0$.

Estimation of Model Parameters

As prior engineering knowledge regarding parameters a and b is obtained, a Bayesian procedure to draw inferences on all parameters $\alpha$, $\beta$, a, b, and $\sigma$ is implemented. In particular, it is assumed that $$a \sim N(1, 2^2), b \sim N(1, 1^2),$$

and flat priors on $\alpha$, $\beta$, and $\log(\sigma)$ is placed, with all parameters independent a priori. The posterior distribution of the parameters by Markov Chain Monte Carlo (MCMC) is calculated, and summarize the marginal posteriors by taking the mean, median, standard deviation, and 2.5% and 97.5% quantiles of the posterior draws.

The MCMC strategy used here is Hamiltonian Monte Carlo (HMC): the logarithm of the posterior is differentiable, and so an MCMC strategy such as HMC which uses the gradient of the log posterior can be expected to perform better than a generic Metropolis-Hastings or Gibbs algorithm, in terms of yielding high quality draws with minimal tuning of the algorithm. See R. Neal, "Mcmc using hamiltonian dynamics," in Handbook of Markov Chain Monte Carlo, S. Brooks, A. Gelman, G. L. Jones, and X.-L. Meng, Eds. Chapman & Hall/CRC Press, 2010, pp. 113-162. The mass matrix was chosen as the negative of the Hessian of the log posterior at the posterior mode, the leapfrog step size was 0.3, and the number of leapfrog steps was 50. 1000 draws from the posterior distribution of these parameters was obtained after a burn-in of 500 draws. Convergence was gauged by analysis of ACF and trace plots of the posterior draws, and the effective sample size (ESS) and Gelman-Rubin statistics. See A. Gelman and D. Rubin, "Inference from iterative simulation using multiple sequences," Statistical Science, vol. 7, no. 4, pp. 457-472, 1992, for these parameters were calculated by using ten independent chains of draws, each having 1000 draws after a burn-in of 500. Summary statistics in Table 2 below suggest effective sampling from the joint posterior of the parameters.

TABLE 2

Summary of posterior draws

| | Mean | SD | 2.5% | Median | 97.5% | ESS | Gelman-Rubin |
|---|---|---|---|---|---|---|---|
| $\alpha$ | −0.0047 | 4.063 × 10$^{-5}$ | −0.0048 | −0.0047 | −0.0047 | 7713.878 | 1 |
| $\beta$ | 0.0059 | 6.847 × 10$^{-5}$ | 0.0058 | 0.0059 | 0.0060 | 8810.248 | 1 |
| a | 1.566 | 0.0084 | 1.5498 | 1.566 | 1.5819 | 7882.552 | 1 |
| b | 1.099 | 0.0120 | 1.0755 | 1.099 | 1.1232 | 8981.86 | 1 |
| $\sigma$ | 0.0019 | 2.503 × 10$^{-5}$ | 0.00185 | 0.0019 | 0.00195 | 8513.814 | 1 |

Figure 12:
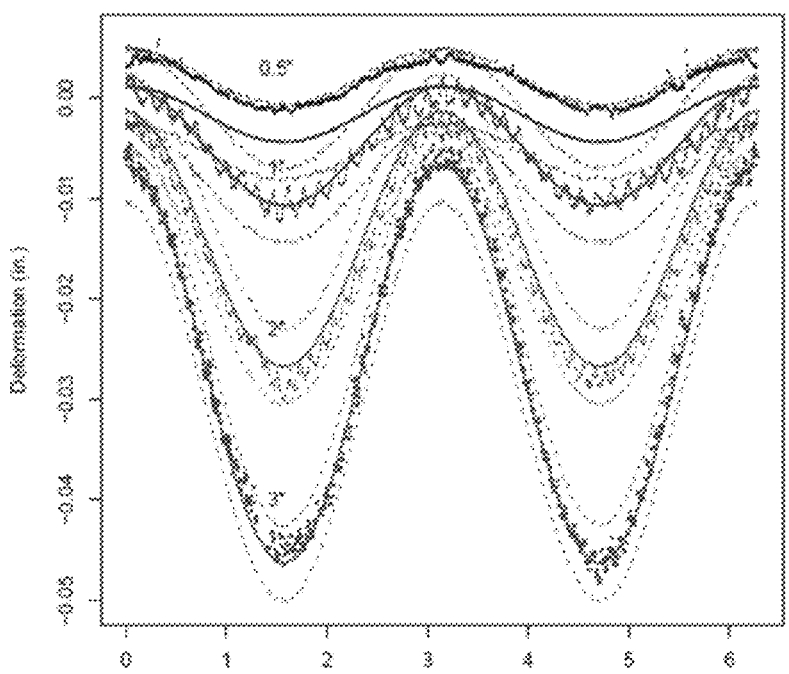
FIG. 12 illustrates an example of posterior predictive distribution for $r_0$=0.5", 1", 2", 3" with no compensation applied.

FIG. 12 illustrates an example of posterior predictive distribution for $r_0$=0.5", 1", 2", 3", and with no compensation applied. This simple comparison of the posterior predictive distribution of shrinkages to the observed data demonstrates the fit for this model. In this figure, bold solid lines denote posterior means, and dashed lines denote the 2.5% and 97.5% posterior quantiles of the shrinkage for each angle, with colors denoting the cylinder radius. This fit captures shrinkages for radius 1", 2", and 3" cylinders fairly well, but does not provide a good fit for the 0.5" radius cylinder: the observed data for this particular cylinder are consistently located too far away from the posterior mean, in consideration of its posterior quantiles.

Figure 13:
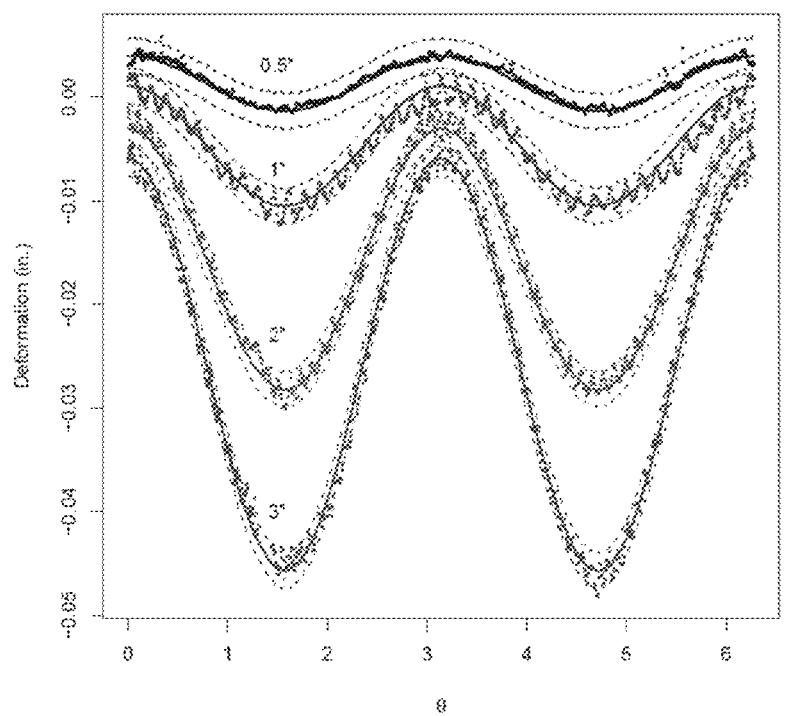
FIG. 13 illustrates an example of posterior predictive distribution for $r_0$=1", 2", 3" with no compensation applied.

FIG. 13 illustrates an example of posterior predictive distribution for $r_0=1''$, $2''$, $3''$, with no compensation applied. In fact, if the model in (11) is fit for all cylinders except the $0.5''$ cylinder, a good fit is still obtained for the remaining cylinders, as seen in FIG. 13. The posterior distribution of the parameters for this fit is summarized in Table 3. Note that the posterior mean and median of σ are now much smaller than before, and that the posterior standard deviations of all parameters decrease. Furthermore, the observed data better correspond to the posterior quantiles in FIG. 13 as opposed to FIG. 12. These considerations suggest that the model does not capture the data for the $0.5''$ radius cylinder, so that including this cylinder in the fitting procedure only served to increase the variance of the parameters. However, the posterior mean of a is 1.4, which doesn't correspond with the previous analytical considerations. A possible reason for this discrepancy, and an improvement of this model, are discussed below in the section Discussion and Model Improvement. For now, model (11) is proposed as the conjectured shrinkage model when no compensation is applied to a cylinder product, with the understanding that this model will be verified by more comprehensive physical experiments.

$$x^*(\theta) = -\frac{\hat{\alpha} r_0^{\hat{a}} + \hat{\beta} r_0^{\hat{b}} \cos(2\theta)}{1 + \hat{a}\hat{\alpha} r_0^{\hat{a}-1} + \hat{b}\hat{\beta} r_0^{\hat{b}-1} \cos(2\theta)}. \quad (14)$$

Validation Experiment

To validate the effectiveness of the compensation strategy in (14) a compensated cylinder with nominal radius $1.0''$ was manufactured. Command law curve in the CAD software UG was employed to construct the compensated CAD model according to (14). All manufacturing and measuring specifications remained the same as in the case of uncompensated cylinders. Parameters α, β, a, and b were set as the mean values in Table 3.

Figure 14:
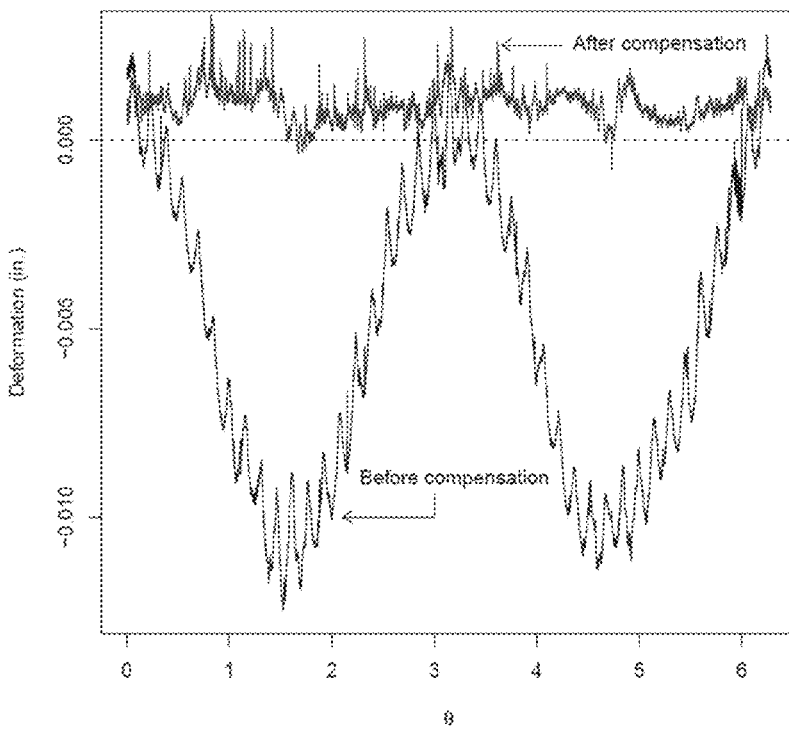
FIG. 14 illustrates validation results of an example of a 1.0" cylinder.

FIG. 14 illustrates validation results of an example of a $1.0''$ cylinder. Shrinkage of the uncompensated cylinder is represented by the lower trace, and shrinkage of the compensated cylinder by the upper trace. The nominal value 0 is plotted as the dashed line. Obviously, absolute shrinkage has significantly decreased under compensation. The sinusoidal pattern of the original shrinkage has also been eliminated. The average and standard deviation of shrinkage for both products are computed. As can be seen in Table 4, the

TABLE 3

Summary of posterior draws, excluding 0.5" radius cylinder

| | Mean | SD | 2.5% | Median | 97.5% | ESS | Gelman-Rubin |
|---|---|---|---|---|---|---|---|
| α | −0.0056 | $2.792 \times 10^{-5}$ | −0.0057 | −0.0056 | −0.00556 | 10002.67 | 1 |
| β | 0.0058 | $4.306 \times 10^{-5}$ | 0.00575 | 0.00584 | 0.00592 | 8908.08 | 1 |
| a | 1.400 | 0.00496 | 1.390 | 1.400 | 1.4098 | 8537.357 | 1 |
| b | 1.114 | 0.00767 | 1.100 | 1.1139 | 1.1301 | 8674.559 | 1 |
| σ | 0.00101 | $1.574 \times 10^{-5}$ | 0.000977 | 0.00101 | 0.00104 | 8997.69 | 1 |

Compensation Model for the Cylinder

Substituting $f(\theta, r_0)$ for the cylinder from equation (11) into the general compensation model (7), the predicted expected shrinkage is $$\hat{E}[\Delta r(\theta, r_0, x(\theta))|\theta] = x(\theta) + \hat{\alpha}\{r_0 + x(\theta)\}^{\hat{a}} + \hat{\beta}\{r_0 + x(\theta)\}^{\hat{b}} \cos(2\theta), \quad (12)$$

where $\hat{\alpha}$, $\hat{\beta}$, $\hat{a}$ and $\hat{b}$ denote the Baye's estimators of model parameters α, β, a and b respectively. Further approximation by the first and the second terms of the Taylor expansion at point $r_0$ yields $$\hat{E}[\Delta r(\theta, r_0, x(\theta))|\theta] \approx \hat{\alpha} r_0^{\hat{a}} + \hat{\beta} r_0^{\hat{b}} \cos(2\theta) + \{1 + \hat{a}\hat{\alpha} r_0^{\hat{a}-1} + \hat{b}\hat{\beta} r_0^{\hat{b}-1} \cos(2\theta)\} x(\theta). \quad (13)$$

This formula may serve as the conjectured compensation model for cylinders. Equation (13) may technically serve as a description of the predicted expected shrinkage of angle θ when compensation $x(\theta)$ is applied to all points on the boundary of the CAD model. In particular, the shrinkage of an angle may depend not only on the compensation applied to it, but also on the compensations applied to its neighboring points. In such a case, the equation above serves as a legitimate description of the shrinkages if the product with a compensation $x(\theta)$ applied to all angles were to be manufactured.

As discussed above in the section Compensation Modeling and Prediction Based on Profile Modeling, setting $\hat{E}[\Delta r(\theta, r_0, x(\theta))|\theta]$ to zero, from (13) there is a closed-form expression for the optimal compensation function, given by average and standard deviation of shrinkage have decreased to 10% of the original. This demonstrates that the compensation method has effectively increased the accuracy of the product. However, the shrinkage under compensation is still above the desired value of 0, which indicates an overall bias of the compensation method. A source and a solution to this bias is now discussed.

TABLE 4

Shrinkage statistics for 1.0" cylinder, before and after compensation (in inches)

| | Mean | SD |
|---|---|---|
| Before compensation | $-5 \times 10^{-3}$ | $4 \times 10^{-3}$ |
| After compensation | $9 \times 10^{-4}$ | $4 \times 10^{-4}$ |

Discussion and Model Improvement

Although shrinkage has decreased considerably in the validation experiment, the compensation strategy has not fully resolved the deformation problem. In particular, if the observed shrinkages in the validation experiment were effectively random noise centered at the target value of 0 with a stable level of variation, then the compensation strategy could be said to have removed deformation. However, in FIG. 14, nearly all observed shrinkages under compensation remain positive, meaning that the manufactured product is uniformly larger than nominal.

Another problem that remains is the poor fit of the current shrinkage model to the $0.5''$ cylinder. Recall that this model provides a good fit for $1.0''$, $2.0''$, and $3.0''$ radius cylinders:

FIG. 13 suggests that it captured the main trend of shrinkage. These observations suggest that some underlying factors that have larger impact on small cylinders are still unaccounted for in this model.

The potential factor is believed to be "over exposure", i.e., expansion of the illuminated shape due to the spread of light beams on the boundary of the product. This phenomenon is suspected to be approximately fixed for any product, implying a larger relative impact on small cylinders.

This effect quantitatively with the experimental data is investigated. A constant effect of over exposure for all cylinders is equivalent to a default compensation $x_0$ applied to every angle in the original CAD model. The predicted shrinkage model would then be given by (12), and reduces to:

$$\hat{E}[\Delta r(\theta,r_0)|\theta] \approx x_0 + \hat{\alpha}(r_0+x_0)^{\hat{a}} + \hat{\beta}(r_0+x_0)^{\hat{b}}\cos(2\theta) \quad (15)$$

Model (15) is fit to the data for 0.5", 1", 2", and 3" radius cylinders, which were earlier assumed to be generated by a model with $x_0=0$. When the same prior specification for $\alpha$, $\beta$, a, b is maintained, and under the assumptions that $x_0>0$ and that this default compensation would be substantially smaller than any of the radii above, a weakly informative prior for $x_0$ of $\log(x_0)\sim N(0,1)$ a priori is adopted.

Figure 15:
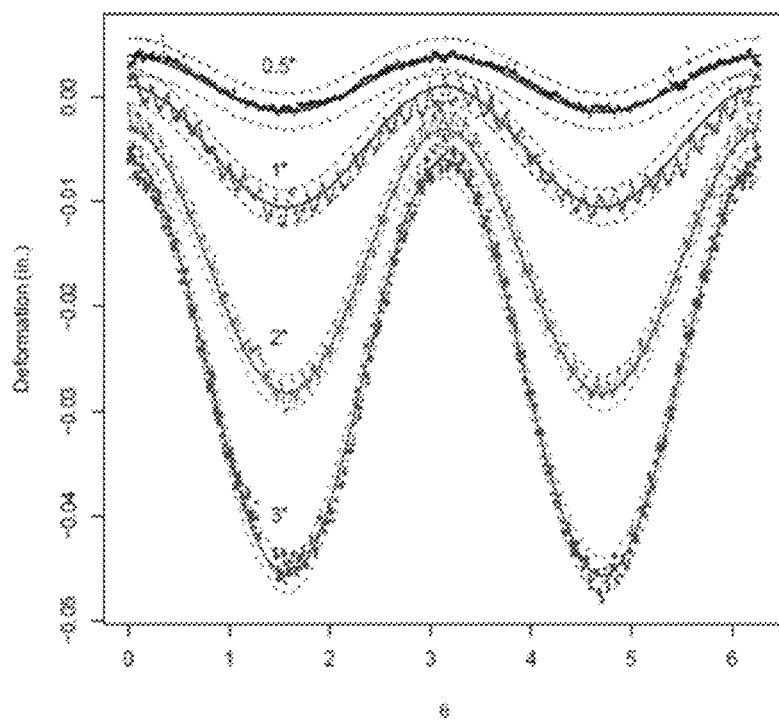
FIG. 15 illustrates an example of posterior predictive distribution for $r_0$=0.5", 1", 2", 3" when modeling over exposure with no compensation applied.

FIG. 15 illustrates an example of posterior predictive distribution for $r_0=0.5"$, 1", 2", 3" when modeling over exposure, with no compensation applied. The same HMC strategy used previously in the section Estimation of Model Parameters is implemented to acquire draws from the posterior distribution of the parameters, which are summarized in Table 5, and the posterior predictive distribution of the shrinkages generated by this model is presented in FIG. 15. This new model provides a substantially better fit for all observed data as compared to the original model (11), suggesting that the conjectured over exposure phenomenon may have been captured.

Table 5 also indicates that the posterior mean of parameter a decreased from 1.4 to 0.86, closer to the theoretical value of 1. The remaining difference is suspected to be associated with the shrinkage of thickness in the z direction, which is ignored in the analysis for simplicity. The estimated value of $x_0$ is slightly less than twice the pixel size (0.005"). This result corresponds with Zhou and Chen's previous work on pixel calibration for the MIP-SLA process, see C. Zhou and Y. Chen, "Calibrating large-area mask projection stereolithography for its accuracy and resolution improvements," in International Solid Freeform Fabrication Symposium, The University of Texas at Austin, 2009. All these considerations suggest that the new model that explicitly includes an over exposure effect provides a better physical interpretation in addition to a better fit to the data.

TABLE 5

Summary of posterior draws when modeling over exposure

| | Mean | SD | 2.5% | Median | 97.5% |
|---|---|---|---|---|---|
| $\alpha$ | −0.0134 | $1.596 \times 10^{-4}$ | −0.0137 | −0.0134 | −0.0131 |
| $\beta$ | 0.0057 | $3.097 \times 10^{-5}$ | 0.00565 | 0.00571 | 0.0058 |
| a | 0.8606 | 0.00733 | 0.8465 | 0.8606 | 0.8752 |
| b | 1.1331 | 0.00546 | 1.123 | 1.1332 | 1.1442 |
| $x_0$ | 0.00879 | 0.00015 | 0.008489 | 0.00879 | 0.00907 |
| $\Sigma$ | 0.000869 | $1.182 \times 10^{-5}$ | 0.000848 | 0.000869 | 0.000892 |

The optimal compensation level under this new model is then derived by following the previous logic, and is $$x^*(\theta) = -\frac{\hat{\alpha}r_0^{\hat{a}} + \hat{\beta}r_0^{\hat{b}}\cos(2\theta)}{1 + \hat{a}\hat{\alpha}r_0^{\hat{a}-1} + \hat{b}\hat{\beta}r_0^{\hat{b}-1}\cos(2\theta)} - x_0. \quad (16)$$

This derivation acknowledges the fact that the amount of compensation $x_0$ will always be automatically added afterwards. Alternatively, or more rigorously, it could be viewed that the nominal process input as $r_0+x_0$, and perform the Taylor expansion at $r_0+x_0$ instead of $r_0$. In this case, the compensation strategy will be $$x^*(\theta) = -\frac{x_0 + \hat{\alpha}(r_0+x_0)^{\hat{a}} + \hat{\beta}(r_0+x_0)^{\hat{b}}\cos(2\theta)}{1 + \hat{a}\hat{\alpha}(r_0+x_0)^{\hat{a}-1} + \hat{b}\hat{\beta}(r_0+x_0)^{\hat{b}-1}\cos(2\theta)}. \quad (17)$$

A comparison of the compensations in (16) and (17) shows effectively no difference (details omitted). Consequently, the compensation strategy given by (17) may be adopted.

To validate the improved model, the compensated 1" and 2.5" cylinders was manufactured with the compensation plan defined by (17) under the same building conditions as before, substituting posterior means of the parameters in this equation.

Figure 16:
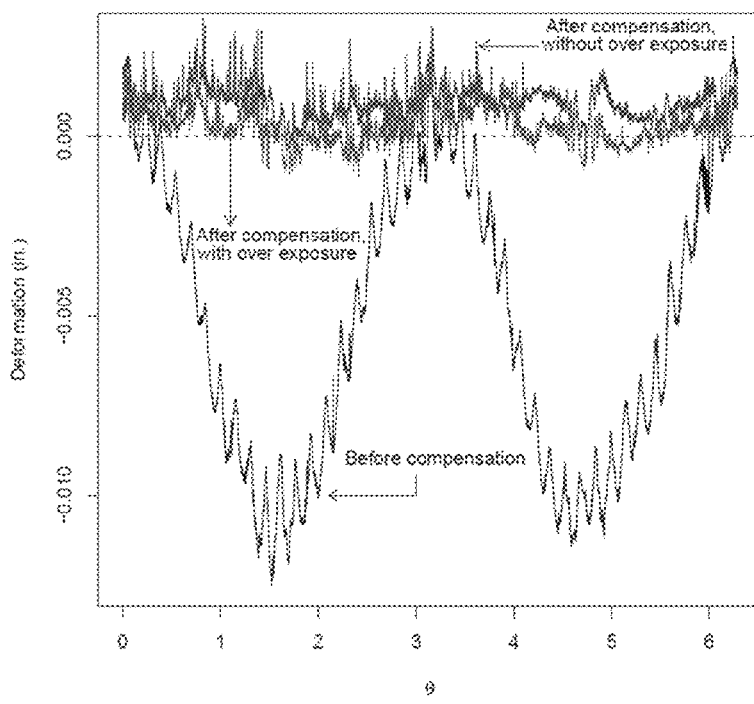
FIG. 16 illustrates an example of validation result of 1.0" cylinder.
Figure 17:
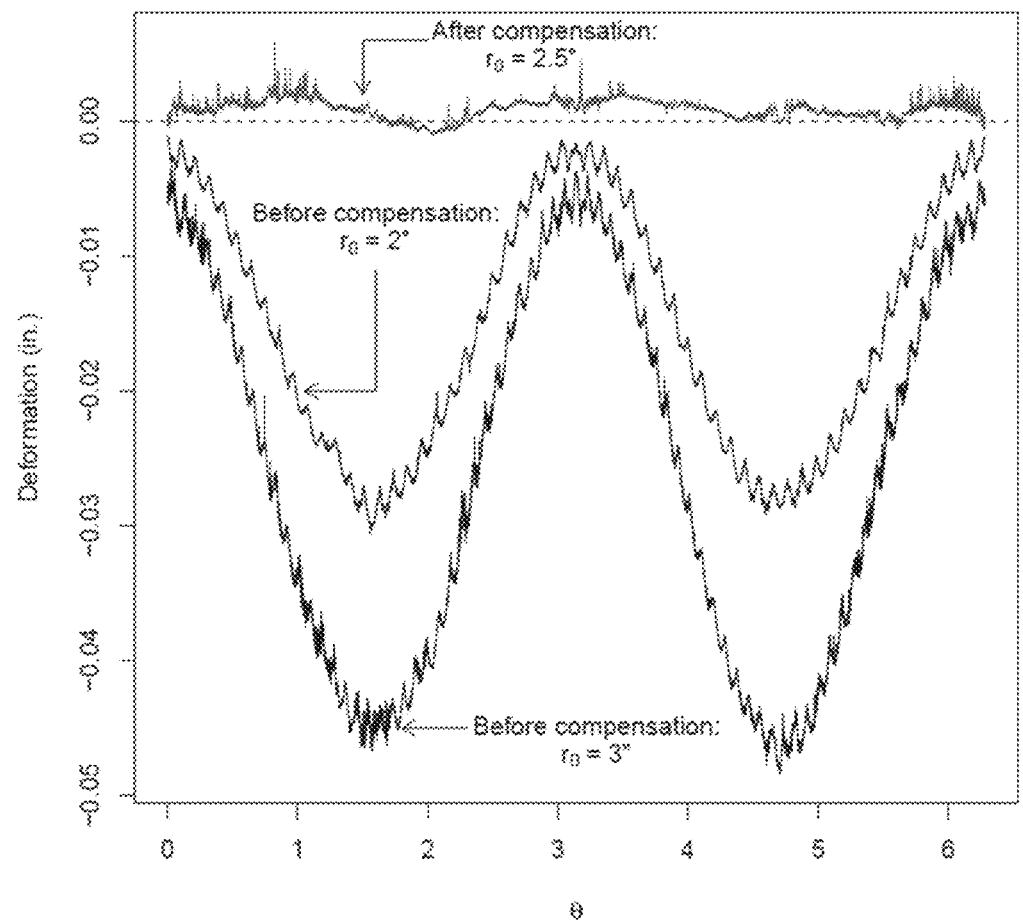
FIG. 17 illustrates an example of validation result of 2.5" cylinder.

FIG. 16 illustrates an example of validation result of 1.0" cylinder. FIG. 17 illustrates an example of validation result of 2.5" cylinder. The measured shrinkage results are shown in FIG. 16 and FIG. 17 respectively. In FIG. 16 a comparison of the uncompensated cylinder, compensated cylinder ignoring over exposure, and compensated cylinder considering over exposure, are demonstrated. Although both compensation methods decrease shrinkage substantially, the product compensated according to over exposure apparently has uniformly smaller shrinkage: its shrinkage curve effectively shifted down closer to the nominal value 0, resolving the compensation bias problem discussed earlier.

FIG. 17 shows the compensation effect for the 2.5" cylinder and its comparison with uncompensated 2.0" and 3.0" cylinders. Obviously shrinkage has been dramatically decreased, and the significant sinusoidal pattern has been eliminated. Note that the 2.5" cylinder has not been constructed before, and so this experiment demonstrates great predictability of the compensation model.

Figure 18:
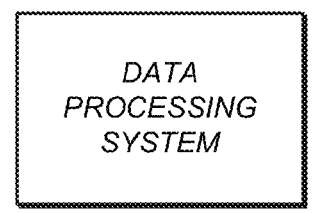
FIG. 18 illustrates a data processing system.

FIG. 18 illustrates a data processing system. This data processing system may be configured to implement all or any combination of the functions that have been described above for minimizing errors caused by material phase change shrinkage during additive layer 3D printing. The data processing system includes one or more processors, tangible memories (e.g., random access memories (RAMs), read-only memories (ROMs), and/or programmable read only memories (PROMS)), tangible storage devices (e.g., hard disk drives, CD/DVD drives, and/or flash memories), system buses, video processing components, network communication components, input/output ports, and/or user interface devices (e.g., keyboards, pointing devices, displays, microphones, sound reproduction systems, and/or touch screens).

The data processing system may include software (e.g., one or more operating systems, device drivers, application programs, and/or communication programs). When software is included, the software includes programming instructions and may include associated data and libraries. When included, the programming instructions are configured to implement one or more algorithms that implement one or more of the functions of the computer system, as recited herein. The description of each function that is performed by each computer system also constitutes a description of the algorithm(s) that performs that function.

The software may be stored on or in one or more non-transitory, tangible storage devices, such as one or more hard disk drives, CDs, DVDs, and/or flash memories. The software may be in source code and/or object code format. Associated data may be stored in any type of volatile and/or non-volatile memory. The software may be loaded into a non-transitory memory and executed by one or more processors.

Figure 19:
FIG. 19 illustrates a computer-readable storage medium.

FIG. 19 illustrates computer-readable storage medium. The storage medium may be a non-transitory, tangible, computer-readable storage medium containing a program of instructions that cause a data processing system running the program of instructions to minimize errors caused by material phase change shrinkage during additive layer 3D printing by implementing all or any combination of the functions that have been described above for minimizing such errors.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and advantages. These also include embodiments in which the components and/or steps are arranged and/or ordered differently.

For example, the multiple points that define the perimeter of a library shape can be represented by a combination of points defining a shape with a smooth perimeter and points defining vertexes connecting two segments of smooth perimeters.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element proceeded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A system for optimizing a computer-aided design (CAD) used in additive manufacturing by minimizing errors caused by material phase change shrinkage during additive manufacturing, comprising:

a processor configured to:

receive geometric characteristics indicative of a shape of a layer of a three-dimensional (3D) object that is to be printed;

select a library shape from a library of shapes that corresponds to the shape of the layer, each library shape in the library of shapes having shrinkage information that includes, for each of a plurality of points that define a perimeter of the library shape, a radial distance to a point from an origin of a coordinate system, an angle the radial distance makes with respect to an axis of the coordinate system, and an anticipated amount by which the point will deviate from a specified location when the shape is printed due to shrinkage, the radial distances of at least one library shape not having a common origin;

determine compensation for anticipated shrinkage of the layer at the plurality of points when printed based on the shrinkage information that is associated with the selected library shape including calculating compensation for each point in the selected library shape;

modify the geometric characteristics indicative of the shape of the layer to be printed to minimize errors caused by shrinkage of the layer when printed based on the calculated compensation;

provide the modified geometric characteristics indicative of the shape of the layer to an additive manufacturing device to construct the layer by additive manufacturing and fabricating the layer;

after the layer is printed using the selected library shape with the modified geometric characteristics indicative of the shape, receive error information indicative of one or more size errors at each of the plurality of points in the layer caused by shrinkage; and create and add a new shape to the library of shapes based on the selected library shape and the error information.

2. The system of claim 1, wherein, for each common origin, there is only a single point at each angle.

3. The system of claim 1, wherein the shrinkage information for at least one of the plurality of points in the library includes a location-dependent component and a location-independent component.

4. The system of claim 1, wherein calculating compensation for each point includes determining a deviation between each point that defines a perimeter of the selected library shape and a corresponding point on the layer that is to be printed.

5. The system of claim 4, wherein calculating compensation for each point further includes, for each point that defines a perimeter of the selected library shape, adjusting the anticipated amount based on the determined deviation between each point and the corresponding point on the layer that is to be printed.

6. A system that minimize errors caused by material phase change shrinkage during additive layer 3D printing, comprising:

a processor configured to:

receive geometric characteristics indicative of a shape of a layer of a three-dimensional (3D) object that is to be printed;

select a library shape from a library of shapes that corresponds to the shape of the layer, each library shape in the library of shapes having shrinkage information that includes, for each of a plurality of points that define a perimeter of the library shape, a radial distance to a point from an origin of a coordinate system, an angle the radial distance makes with respect to an axis of the coordinate system, and an anticipated amount by which the point will deviate from a specified location when the shape is printed due to shrinkage, the radial distances of at least one library shape not having a common origin;

determine compensation for anticipated shrinkage of the layer at the plurality of points when printed based on the shrinkage information that is associated with the selected library shape including calculating a Taylor series expansion of the shrinkage information;

modify the geometric characteristics of the shape of the layer to be printed to minimize errors caused by shrinkage of the layer when printed based on the determined compensation;

provide the modified geometric characteristics indicative of the shape of the layer to an additive manufacturing device to construct the layer by additive manufacturing and fabricating the layer;

after the layer is printed using the selected library shape with the modified geometric characteristics indicative of the shape, receive error information indicative of one or more size errors at each of the plurality of points in the layer caused by shrinkage; and create and add a new shape to the library of shapes based on the selected library shape and the error information.

7. The system of claim 6, wherein, for each common origin, there is only a single point at each angle.

8. The system of claim 6, wherein the shrinkage information for at least one of the plurality of points includes a location-dependent component and a location-independent component.

9. The system of claim 6, wherein determining compensation for anticipated shrinkage further includes determining a deviation between each point that defines a perimeter of the selected shape and a corresponding point on the to-be-printed layer.

10. The system of claim 9, wherein determining compensation for anticipated shrinkage further includes adjusting the anticipated amount based on the determined deviation between each point and the corresponding point on the to-be-printed layer between the point and the corresponding point on the layer that is to be printed.

* * * * *